United States Patent [19]
Wu

[11] Patent Number: 5,834,353
[45] Date of Patent: Nov. 10, 1998

[54] METHOD OF MAKING DEEP SUB-MICRON METER MOSFET WITH A HIGH PERMITIVITY GATE DIELECTRIC

[75] Inventor: Shye-Lin Wu, Hsinchu, Taiwan

[73] Assignee: Texas Instruments-Acer Incorporated, Hsinchu, Taiwan

[21] Appl. No.: 954,416

[22] Filed: Oct. 20, 1997

[51] Int. Cl.$^6$ .................................................. H01L 21/336
[52] U.S. Cl. ........................... 438/287; 438/591; 438/770
[58] Field of Search .................................... 438/287, 305, 438/306, 513, 591, 636, 769, 770, 785

[56] References Cited

U.S. PATENT DOCUMENTS

| | | | |
|---|---|---|---|
| 5,393,783 | 2/1995 | Mathews et al. | 438/591 |
| 5,464,783 | 11/1995 | Kim et al. | 438/287 |
| 5,712,208 | 1/1998 | Tseng et al. | 438/287 |

OTHER PUBLICATIONS

Hisayo Sasaki Momose et al. "High–Frequency AC Characteristics of 1.5 nm Gate Oxide Mosfets" *IEEE*. 1996. pp. 105–108.

Chuan Lin et al. "Leakage Current, Reliability Characteristics, and Boron Penetration of Ultra–Thin (32–36Å) $O_2$–Oxides and $N_2O/NO$ Oxynitrides" *IEEE*, 1996, pp. 331–334.

S. C. Sun et al. "A Novel Approach for Leakage Current Reduction of LPCVD $Ta_2O_5$ and $TiO_2$ Films by Rapid Thermal $N_2O$ Annealing" *IEEE*, 1994, pp. 333–336.

Ruth Dejule "Meeting the Ultra–Shallow Junction Challenge" *Semiconductor International*, Apr. 1997.

*Primary Examiner*—Chandra Chaudhari
*Attorney, Agent, or Firm*—Merchant, Gould, Smith, Edell, Welter and Schmidt

[57] ABSTRACT

The method of the present invention includes forming a silicon oxynitride layer on a substrate. Then, a dielectric layer with high permitivity is deposited by chemical vapor deposition on the silicon oxynitride layer. Subsequently, a rapid thermal process (RTP) anneal is performed in $N_2O$ or NO ambient to reduce the dielectric leakage. A multiple conductive layer consisting of TiN/Ti/TiN is then formed on the dielectric layer. Then, the multiple conductive layer, the dielectric layer, and the silicon oxynitride layer are patterned to form gate structure. A plasma immersion is performed to form ultra shallow extended source and drain junctions. Side wall spacers are formed on the side walls of the gate structure. Next, an ion implantation is carried out to dope ions into the substrate. Next, a rapid thermal process (RTP) anneal is performed to form shallow junctions of the source and the drain.

16 Claims, 2 Drawing Sheets

5,834,353

METHOD OF MAKING DEEP SUB-MICRON METER MOSFET WITH A HIGH PERMITIVITY GATE DIELECTRIC

The present invention relates to a semiconductor device, and more specifically, to a method of fabricating a metal oxide semiconductor field effect transistor (MOSFET) with a high permitivity gate dielectric.

BACKGROUND OF THE INVENTION

In recent year, the reduction of semiconductor devices and increased packing density have driven the integrated circuits technologies toward deep sub-micron meter range. Various issues arise when the size of the semiconductor devices are scaled down. For example, one of the most traditionally and widely used semiconductor devices is metal oxide semiconductor field effect transistor (MOSFET). As the trend of the integrated circuits, the fabrication of the MOSFET meets some problems, one of the typical problems is short channel effect. The issue is caused by hot carriers that will inject into gate oxide, and which is overcame by the development of lightly doped drain (LDD) structure. In order to manufacture a transistor for 0.1 micron meter ULSI, the gate oxide thickness of MOSFET has to be scaled down less than 2 nm. See "HIGH-FREQUENCY AC CHARACTERISTICS OF 1.5 nm GATE OXIDE MOSFETS, Hisayo Sasaki Momose et al., 1996, IEEE, IEDM 96–105". In the sub-micron range, the thin gate oxide induces an issue associated with ions that penetrate from doped polysilicon gate into silicon substrate. This is referred to so called initial gate oxide leakage. Thus, the reliability of gate oxide is an important issue for deep sub-micron meter devices. Please see "LEAKAGE CURRENT, RELIABILITY CHARACTERISTIC, and BORON PENETRATION of ULTRA-THIN $O_2$ OXIDE and $N_2O$/NO OXYNITRIDES, Chuan Lin, al., 1996, IEEE, IEDM 96–331". Chuan has proposed that the $N_2O$ oxide exhibits lower initial leakage current than $O_2$ oxide in the ultra-thin oxide region, that is important for low power applications. However, it is hard to fabricate such ultra thin oxide film without pin hole.

Another prior art overcomes aforesaid issue is the use of rapid thermal annealing. The method can effectively suppress the leakage current of dielectric thin films. See "A NOVEL APPROACH LEAKAGE REDUCTION of LPCVD $Ta_2O_5$ and $TiO_2$ FILMS by RAPID THERMAL $N_2O$ ANNEALING, S. C. Sun et al., 1994, IEEE, IEDM 94–333". To achieve devices with deep sub-micron meter range, the devices have to be scaled proportionally with channel length, source and drain junction, and the shallower source, drain extensions. The requirement of future device is low-energy ion implants with high currents and parallel beams. Plasma immersion doping is relativity simple and can achieve the purpose. See "MEETING the ULTRA-SHALLOW JUNCTION CHALLENGE, Ruth DeJule, SEMICONDUCTOR INTERNATIONAL, 1997". The semiconductor substrate is immersed in a high density plasma, and the devices is formed to have ultra shallow extended source, drain junctions.

SUMMARY OF THE INVENTION

The method of the present invention includes forming a silicon oxynitride layer on a substrate. The silicon oxynitride layer is preferably deposited by thermal oxidation in $N_2O$ or NO ambient. Then, a dielectric layer with high permitivity is deposited by chemical vapor deposition on the silicon oxynitride layer. The dielectric layer is chosen from a group of $TiO_2$, $Ta_2O_5$, PZT or BST. Subsequently, a rapid thermal process (RTP) anneal is performed at a temperature about 800 to 900 centigrade in $N_2O$ or NO ambient to reduce the dielectric leakage.

A multiple conductive layer is then formed on the dielectric layer. The multiple conductive layer is consisted of a TiN layer that is formed on the dielectric layer to serve as a barrier metal layer. A metal layer is formed on the TiN layer for acting a gate of a transistor. Preferably, the metal layer is formed of titanium or tungsten. Next, an anti-refractive coating (ARC) layer is formed on the metal layer. Then, the multiple conductive layer, the dielectric layer, and the silicon oxynitride layer are patterned to form gate structure. A plasma immersion is performed to form ultra shallow extended source and drain junctions adjacent to the gate structure. Side wall spacers are formed on the side walls of the gate structure. Next, an ion implantation is carried out to dope ions into the substrate. Next, a rapid thermal process (RTP) anneal is performed to form shallow junctions of the source and the drain.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
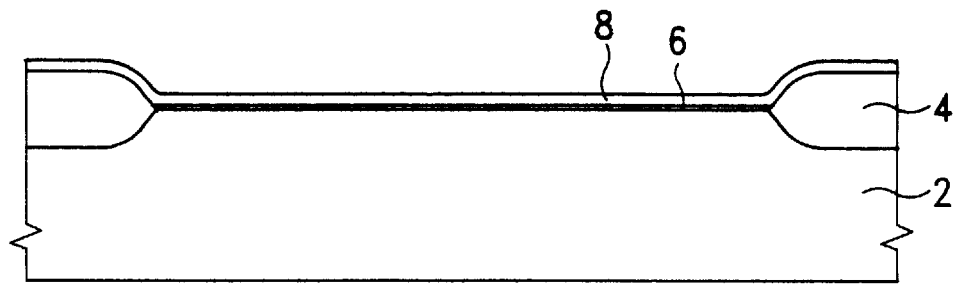
FIG. 1 is a cross section view of a semiconductor wafer illustrating the steps of forming a silicon oxynitride layer and a high permitivity layer on a semiconductor substrate according to the present invention.
Figure 2:
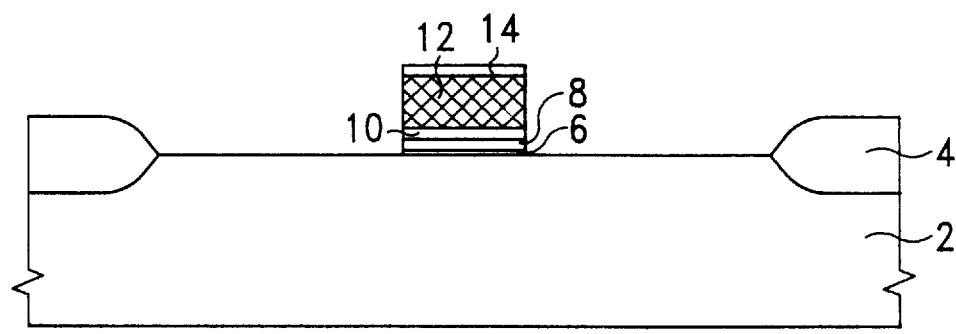
FIG. 2 is a cross section view of a semiconductor wafer illustrating the step of forming a gate structure according to the present invention.

In a preferred embodiment, a single crystal silicon substrate 2 with a <100>crystallographic orientation is provided. A thick field oxide (FOX) regions 4 are formed to provide isolation between devices on the substrate. For example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX regions 4 to a thickness of about 3000–8000 angstroms. The FOX regions 4 can be replaced by a plurality of shallow trench isolations, as well known in the art.

Next, an ultra thin silicon oxynitride layer 6 is formed on the top surface of the substrate 2 to have a thickness about 10 to 20 angstroms. The silicon oxynitride layer 6 is preferably deposited by thermal oxidation in $N_2O$ or NO ambient at a temperature about 600 to 1150 centigrade. Then, a thin dielectric layer 8 with high permitivity is deposited by chemical vapor deposition on the silicon oxynitride layer 6. In this embodiment, the thickness of the dielectric layer 8 is approximately 30 to 200 angstroms. The dielectric layer 8 can be chosen from a group of $TiO_2$, $Ta_2O_5$, PZT or BST, which have relatively high dielectric to silicon oxide, silicon nitride or the like. Subsequently, a rapid thermal process (RTP) anneal is performed at a temperature about 800 to 1150 centigrade in $N_2O$ or NO ambient to reduce the dielectric leakage. Typically, the RTP in $N_2O$ or NO can effectively suppress leakage current of aforesaid high permitivity materials, such as $TiO_2$, $Ta_2O_5$. Thus, this step is used to achieve the dielectric layer 8 with low leakage and superior reliability.

A multiple conductive layer is then formed on the dielectric layer 8. The multiple conductive layer is consisted of a TiN layer 10 that is formed on the dielectric layer 8 to serve as a barrier layer. The thickness of the barrier metal layer 10 is about 100 to 2000 angstroms. A metal layer 12 is successively formed on the TiN layer 10 for acting a gate of a transistor. Preferably, the metal layer 12 is formed of titanium or tungsten. The thickness of the metal layer 12 is about 500 to 3000 angstroms. The barrier metal layer 10 can prevent the titanium 12 from erosion with the silicon substrate 2. Next, an anti-refractive coating (ARC) layer 14, such as TiN, is formed on the metal layer 12 to have a thickness of about 100 to 1500 angstroms. Then, the multiple conductive layer, the dielectric layer 8, and the silicon oxynitride layer 6 are patterned to form gate structure by lithography and etching. The dielectric layer 8, and the silicon oxynitride layer 6 are used as the gate dielectric.

Figure 3:
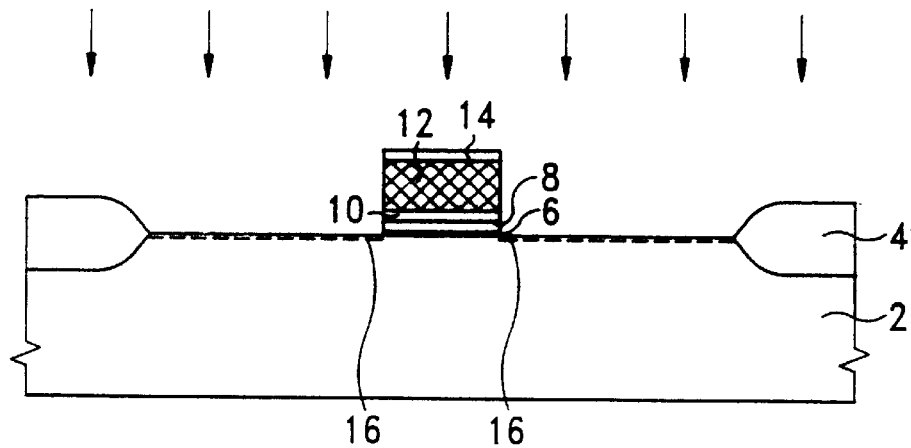
FIG. 3 is a cross section view of a semiconductor wafer illustrating the step of performing a plasma immersion according to the present invention.
Figure 4:
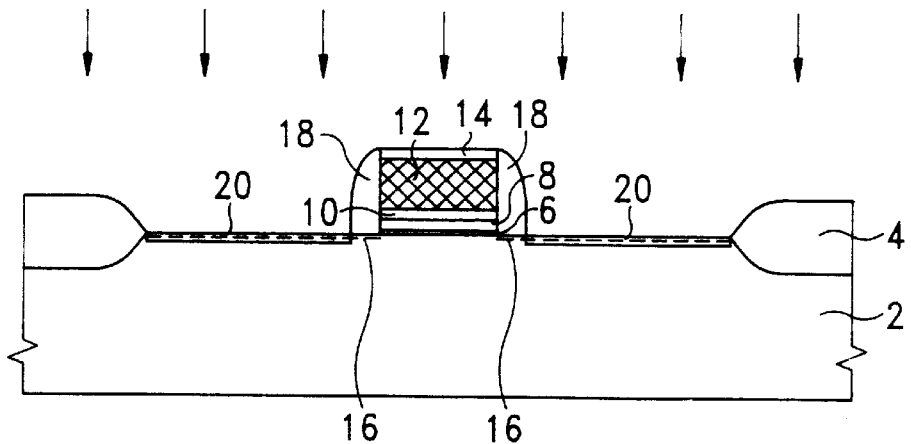
FIG. 4 is a cross section view of a semiconductor wafer illustrating the step of performing an ion implantation to form the source and drain according to the present invention.

Turning to FIG. 3, a plasma immersion is performed using the gate structure as a mask to form ultra shallow extended source and drain junctions adjacent to the gate structure. As shown in FIG. 4, side wall spacers 18 are formed on the side walls of the gate structure. The side wall spacers are formed by etching a dielectric layer, such as oxide, that is followed by depositing dielectric layer. Next, an ion implantation is carried out to dope ions into the substrate 2 using the gate structure and the side wall spacers 18 as a mask. Preferably, the ion implantation is performed with low energy and high dosage. Thus, the dosage of the ion implantation is about 5E14 to 2E16 atoms/cm$^2$. While the energy of the ion implantation is about 5 to 12 KeV.

Figure 5:
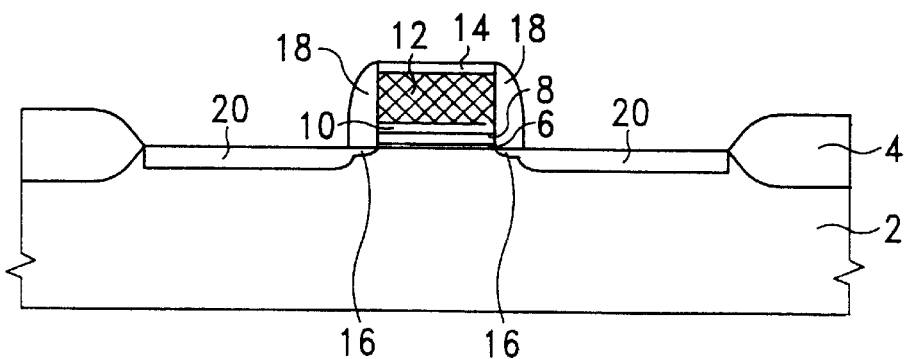
FIG. 5 is a cross section view of a semiconductor wafer illustrating the step of performing a rapid thermal process according to the present invention.

Next, turning to FIG. 5, a rapid thermal process (RTP) anneal is performed to form shallow junctions of the source and the drain 20. The temperature of the RTP is appropriate 800 to 1150 centigrade.

As shown in FIG. 5, the transistor includes a gate dielectric layer formed on the semiconductor substrate 2. The gate dielectric layer includes a silicon oxynitride sub-layer 6 formed on the substrate 2, and a dielectric sub-layer 8 having relatively high permitivity to an oxide formed on the silicon oxynitride sub-layer 6. A barrier layer 10 composed of Ti is formed on the gate dielectric layer 8. A metal gate 12 composed of Ti or W is formed on the barrier layer 10. An anti-refractive coating layer 14 is formed on the metal gate 12. The gate dielectric layer, the barrier layer, anti-refractive coating layer 14 and the metal gate constructs a gate structure. Side wall spacers are formed on side walls of the gate structure. Extended source, drain junctions formed under the side wall spacers, in the semiconductor substrate and adjacent to the gate structure, and source and drain junctions formed in the gate structure next to the extended source, drain junctions.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a transistor on a semiconductor substrate, said method comprising the steps of:

forming a silicon oxynitride layer on said semiconductor substrate;

forming a dielectric layer having relatively high permitivity to an oxide layer on said silicon oxynitride layer;

performing a first rapid thermal process (RTP) to reduce dielectric leakage of said dielectric layer;

forming a barrier layer on said dielectric layer;

forming a metal layer in said barrier layer;

forming a anti-refractive layer on said metal layer;

patterning said anti-refractive layer, said metal layer, said barrier layer, said dielectric layer and said silicon oxynitride layer to form a gate structure;

performing a plasma immersion using said gate structure as a mask to form extended source and drain junctions;

forming side wall spacers on side walls of said gate structure;

performing an ion implantation using said side wall spacers and said gate structure as a mask to form a source and a drain; and performing a second rapid thermal process (RTP) to form junctions of said source and drain.

2. The method of claim 1, wherein said first rapid thermal process (RTP) is performed in $N_2O$ ambient.

3. The method of claim 2, wherein said first rapid thermal process (RTP) is performed at a temperature at about 800 to 1150 centigrade.

4. The method of claim 1, wherein said first rapid thermal process (RTP) is performed in NO ambient.

5. The method of claim 4, wherein said first rapid thermal process (RTP) is performed at a temperature at about 800 to 1150 centigrade.

6. The method of claim 1, wherein said second rapid thermal process (RTP) is performed at a temperature at about 800 to 1150 centigrade.

7. The method of claim 1, wherein said dielectric layer comprises $TiO_2$.

8. The method of claim 1, wherein said dielectric layer comprises $Ta_2O_5$.

9. The method of claim 1, wherein said dielectric layer comprises PZT.

10. The method of claim 1, wherein said dielectric layer comprises BST.

11. The method of claim 1, wherein said silicon oxynitride layer is formed by oxidation in $N_2O$ ambient.

12. The method of claim 1, wherein said silicon oxynitride layer is formed by oxidation in NO ambient.

13. The method of claim 1, wherein said barrier layer comprises TiN.

14. The method of claim 1, wherein said metal layer comprises titanium.

15. The method of claim 1, wherein said metal layer comprises tungsten.

16. The method of claim 1, wherein said anti-refractive layer comprises TiN.

* * * * *